(12) United States Patent
Sumiyoshi (10) Patent No.: US 10,191,394 B2
(45) Date of Patent: Jan. 29, 2019

(54) DISTORTION DETECTION METHOD, EXPOSURE APPARATUS, EXPOSURE METHOD, AND DEVICE MANUFACTURING METHOD

(71) Applicant: CANON KABUSHIKI KAISHA, Tokyo (JP)

(72) Inventor: Yuhei Sumiyoshi, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 91 days.

(21) Appl. No.: 15/247,481

(22) Filed: Aug. 25, 2016

(65) Prior Publication Data

US 2017/0060000 A1    Mar. 2, 2017

(30) Foreign Application Priority Data

Sep. 2, 2015    (JP) .................................. 2015-173271

(51) Int. Cl.
*G06F 7/20* (2006.01)
*G03F 7/20* (2006.01)

(52) U.S. Cl.
CPC .............................. *G03F 7/70783* (2013.01)

(58) Field of Classification Search
CPC ............ G03F 7/70783; G03F 7/70633; G03F 7/70508; G03F 7/70425; G03F 7/70525
See application file for complete search history.

(56) References Cited

U.S. PATENT DOCUMENTS

| 5,525,808 A * | 6/1996 | Irie | ....................... G03F 9/7003 250/548 |
| 6,888,620 B2 * | 5/2005 | Lee | ......................... G03F 7/707 355/53 |
| 2010/0104960 A1 * | 4/2010 | Koga | ..................... G03B 27/42 430/30 |

FOREIGN PATENT DOCUMENTS

JP    2010-166007 A    7/2010
JP         4794882 B2    10/2011

\* cited by examiner

*Primary Examiner* — Steven Whitesell Gordon
(74) *Attorney, Agent, or Firm* — Canon U.S.A., Inc. IP Division (57) ABSTRACT

A distortion detection method includes obtaining a positional deviation amount expression formula that expresses positional deviation amounts in two directions at each position on a substrate held by a chuck, based on information about a warping shape of the substrate in a state where the substrate is not yet held by the chuck, calculating positional deviation amounts in two directions at a plurality of positions on the substrate based on the obtained positional deviation amount expression formula, and obtaining a plurality of types of distortion components relating to a shot region of the substrate based on the positional deviation amounts in two directions obtained at the plurality of positions.

20 Claims, 8 Drawing Sheets

DISTORTION DETECTION METHOD, EXPOSURE APPARATUS, EXPOSURE METHOD, AND DEVICE MANUFACTURING METHOD

BACKGROUND OF THE INVENTION

Field of the Invention

The aspects of the present invention relate to a distortion detection method, an exposure apparatus, an exposure method, and a device manufacturing method.

Description of the Related Art

The exposure apparatus is used to manufacture semiconductor devices and flat panel display devices. With high integration of semiconductor devices and definition enhancement of flat panel display devices, refined and multilayered wirings have developed. The process of forming multilayered wiring layers induces a warping phenomenon of a substrate (e.g., wafer or glass substrate) that occurs entirely because film distortions generated during a film-forming operation tend to accumulate in post-processes of a semiconductor manufacturing process. Reshaping the warped substrate into a planer substrate is feasible by causing a substrate chuck provided on a substrate stage of the exposure apparatus to attract and hold the substrate. In this case, local distortions appear in the substrate fixed on substrate chuck. The overlay accuracy decreases.

There is a conventionally proposed method for measuring a plurality of alignment marks formed in each shot region and performing positional alignment in such a way as to improve the overlay accuracy considering such local distortions generated on the substrate.

A scanning type exposure apparatus discussed in Japanese Patent No. 4794882 changes the scanning speed of a stage that scans a substrate according to a warping amount of the substrate so as to correct distortions of respective shot regions.

According to the technique discussed in Japanese Patent No. 4794882, the distortion component corrected with respect to the shot region (i.e., shape) is limited to the magnification in a scanning direction. Therefore, it is desired that exposure apparatuses have the capability of correcting a plurality of types of distortion components in respective shot regions so that the overlay accuracy can be further improved.

SUMMARY OF THE INVENTION

According to an aspect of the present invention, a distortion detection method includes obtaining a positional deviation amount expression formula that expresses positional deviation amounts in two directions at each position on a surface of a substrate held by a chuck, based on information about a warping shape of the substrate in a state where the substrate is not yet held by the chuck, calculating positional deviation amounts in two directions at a plurality of positions on the substrate surface based on the obtained positional deviation amount expression formula, and obtaining a plurality of types of distortion components relating to a shot region of the substrate based on the positional deviation amounts in two directions obtained at the plurality of positions.

Further features of the aspects of the present invention will become apparent from the following description of exemplary embodiments with reference to the attached drawings.

DESCRIPTION OF THE EMBODIMENTS

Hereinbelow, exemplary embodiments of the aspects of the present invention will be described in detail below with reference to attached drawings.

An exposure apparatus according to a first exemplary embodiment will be described in detail below with reference to FIGS. 1 to 7H.

Figure 1:
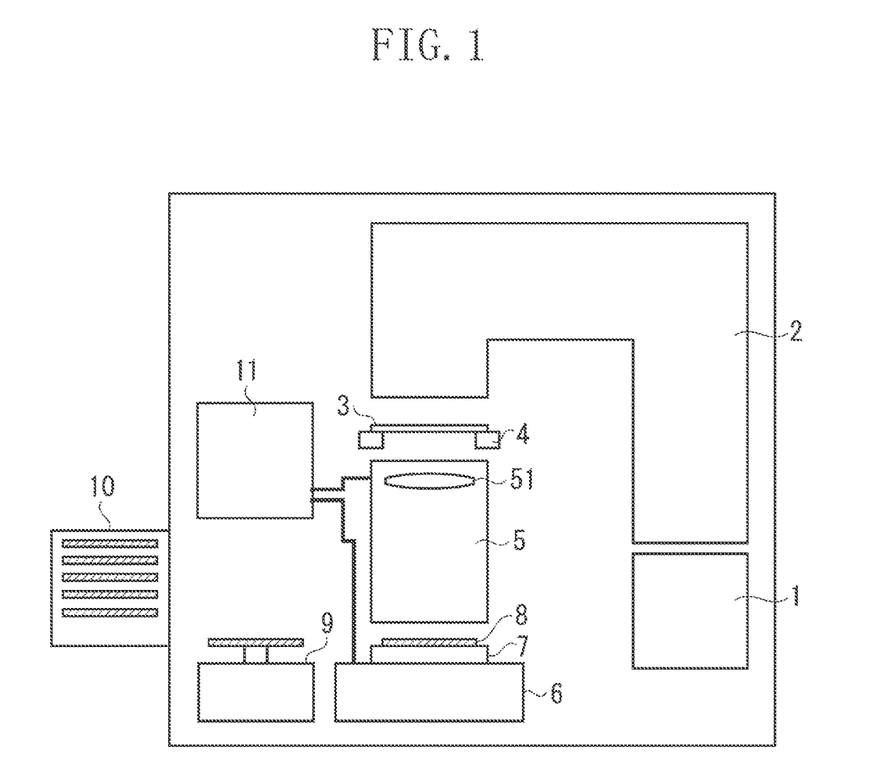
FIG. 1 illustrates a representative configuration of an exposure apparatus according to a first exemplary embodiment.

FIG. 1 illustrates a representative configuration of the exposure apparatus according to the first exemplary embodiment. The exposure apparatus according to the present exemplary embodiment includes a light source unit 1 as illustrated in FIG. 1. The light source is, for example, a high-pressure mercury lamp or an excimer laser. In a case where the light source is an excimer laser, the light source unit 1 can be an internal unit provided in an exposure apparatus chamber or can be an externally provided unit.

An illumination system 2 can illuminate a mask 3 held by a mask stage 4 with light emitted from the light source unit 1. The mask 3 is also referred to as "reticle". A circuit pattern to be transferred is drawn on the mask 3. The light having illuminated the mask 3 passes through a projection optical system 5 (i.e., projection unit) and reaches a wafer 8. In the present exemplary embodiment, the wafer 8 is a silicon wafer or a reconstituting substrate and is hereinbelow referred to as "wafer". In the present exemplary embodiment, the reconstituting substrate is a substrate including a plurality of chips having been cut from another substrate and bonded with a mold.

In this case, the pattern formed on the mask 3 is transferred to a photosensitive medium (e.g., resist) coated on the wafer 8 by the projection optical system 5. The wafer 8 is fixed (chucked) on a wafer chuck 7 by means of a vacuum chuck in such a way as to maintain a corrected flat state. Thus, even in a state where the wafer 8 is in a warped state, it is feasible to perform exposure without departing from the focusing range of the projection optical system 5.

Further, the wafer chuck 7 is held by a wafer stage 6 (i.e., moving unit). The wafer stage 6 is configured to be movable. Then, the wafer stage 6 can be two-dimensionally moved stepwise along a plane perpendicular to the optical axis of the projection optical system 5, to repetitively expose a plurality of shot regions on the wafer 8. In other words, such an exposure apparatus is referred to a step-and-repeat type exposure apparatus. However, the present exemplary embodiment is also applicable to a step-and-scan type exposure apparatus that performs scan and exposure operations while synchronizing the mask stage 4 with the wafer stage 6.

According to the exposure apparatus illustrated in FIG. 1, the wafer 8 to be subjected to exposure processing is set on the exposure apparatus in a state where the wafer 8 is placed in a wafer cassette 10. The wafer cassette 10 may store at least one wafer 8 (a plurality of wafers 8 ordinarily). One wafer 8 is taken out of the wafer cassette 10 by a robot hand (not illustrated) and is placed on a pre-alignment unit 9 (i.e., measurement unit). The pre-alignment unit 9 performs azimuth alignment and positional alignment for the wafer 8. Subsequently, the wafer 8 is set on the wafer chuck 7 by the robot hand and is subjected to the exposure processing. When the exposure processing completes, the robot hand removes the wafer 8 from the wafer chuck 7 and conveys (returns) the wafer 8 to the wafer cassette 10. Then, the robot hand sets the next wafer 8, which is in a standby state at the pre-alignment unit, 9 on the wafer chuck 7. As mentioned above, the prepared wafers are successively subjected to the exposure processing. As another example, the exposure apparatus may be connected to another apparatus (e.g., a coating developing apparatus) in a line manner. In this case, each processing target wafer 8 is carried into the exposure apparatus from another apparatus. Each wafer 8 having been subjected to the exposure processing may be conveyed to another apparatus.

Further, the exposure apparatus includes a control unit 11. The control unit 11 is an information processing apparatus (e.g., a computer), which can control each unit (or device) of the exposure apparatus and perform various calculations.

Figure 2:
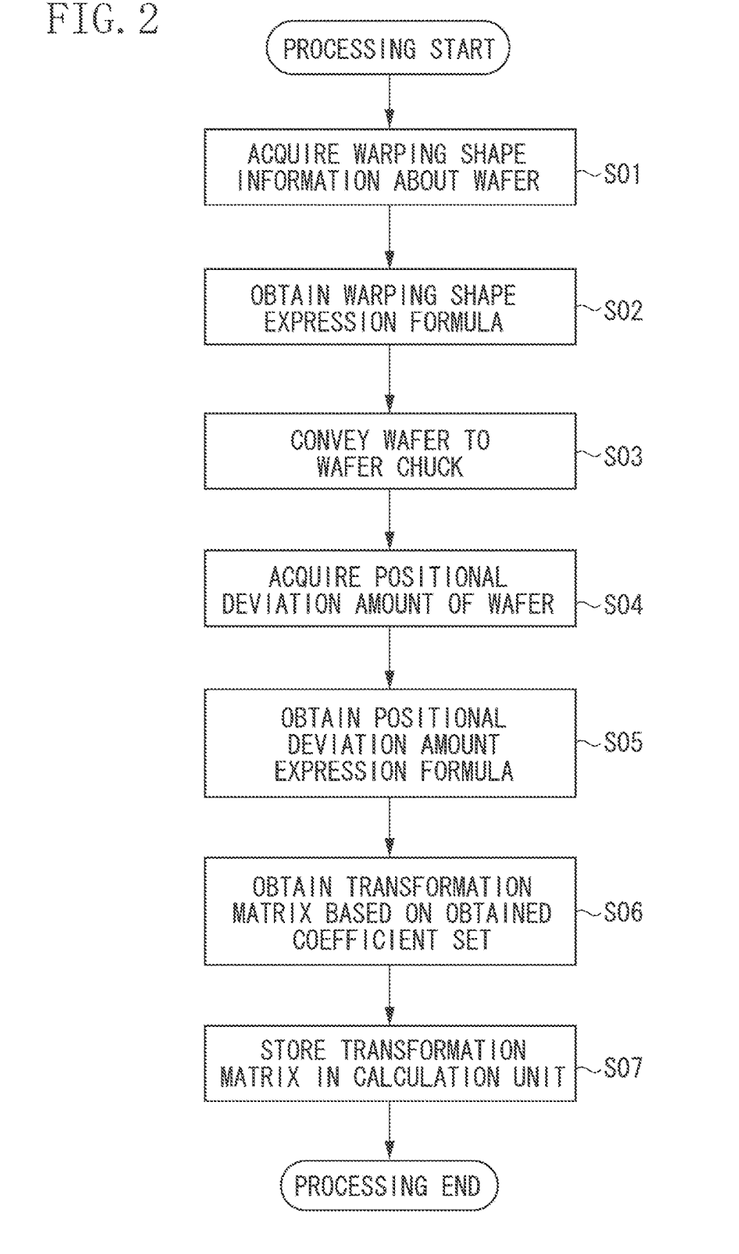
FIG. 2 is a flowchart illustrating processing for obtaining a transformation matrix based on a warping shape of a wafer.

Next, an example method for performing a projection exposure position alignment and a projection exposure shape correction according to the distortion acquired based on warping shape information will be described. FIG. 2 is a flowchart illustrating processing for obtaining a transformation matrix based on a warping shape of the wafer.

In step S01, the exposure apparatus acquires warping shape information about the wafer (i.e., substrate) and stores the acquired warping shape information in a storage device of the control unit 11. More specifically, the exposure apparatus acquires a plurality of pieces of warping shape information, for at least one wafer, by causing an external or internal measurement device to measure the warping shape information in a state where the wafer is not yet fixed by the wafer chuck. In the present exemplary embodiment, the warping shape information is a warping amount relative to a flat surface that passes through the center of the wafer surface and is parallel to the wafer surface (i.e., a distance from the flat surface) at least one point on the wafer surface. Alternatively, considering the necessity of measuring various warping shapes, a calculator simulation using a finite element method is employable in acquiring the warping shape information. Further, the exposure apparatus can acquire external warping shape information. For example, an operator can input warping shape information via the console. Alternatively, in a case where the exposure apparatus is connected to a network (e.g., LAN), an external measurement device, a server, or any other apparatus connected to the network can input warping shape information to the exposure apparatus via the network.

Figures 3A, 3B:
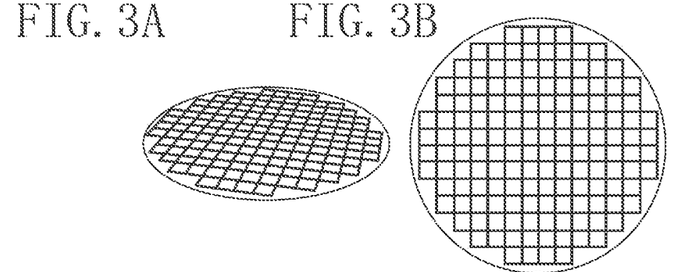
FIGS. 3A to 3H illustrate correspondence relationships between warping shape and distortion.
Figures 3C, 3D:
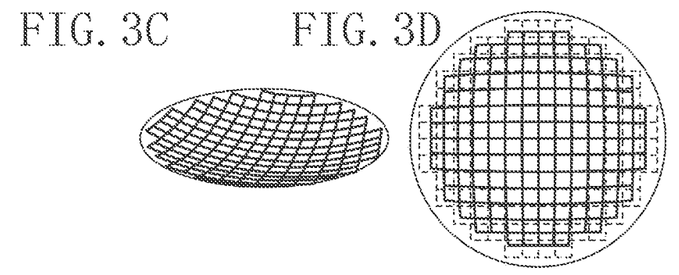
Figures 3E, 3F:
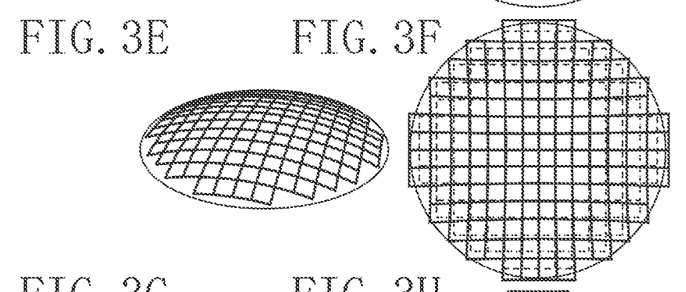
Figures 3G, 3H:
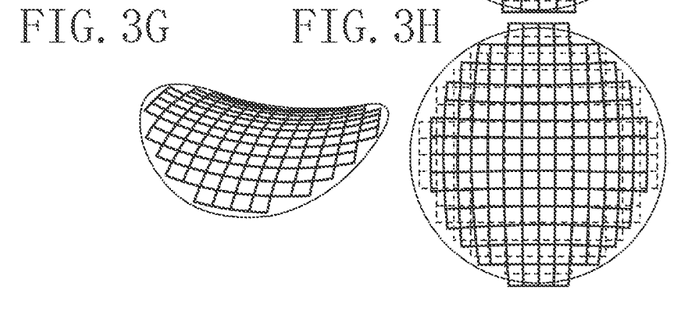

In step S02, the control unit 11 obtains a warping shape expression formula based on the acquired warping shape information beforehand. Hereinbelow, the warping shape information and the warping shape expression formula will be described in detail below. Each of FIGS. 3A to 3H illustrates a correspondence relationship between the warping shape and the distortion generated in a state where the wafer is fixed by the wafer chuck. FIG. 3A illustrates a flat wafer that is free from warping, which is seen from an obliquely upper position. FIG. 3B is a plan view illustrating the wafer illustrated in FIG. 3A in a state where the wafer is fixed by the wafer chuck. In FIG. 3B, a circumferential circular line represents a wafer edge and internal latticed lines represent a wafer grid. The state illustrated in FIG. 3B includes no distortion because the wafer is free from warping. Similarly, FIG. 3C illustrates a wafer having a downwardly protruding convex surface, which is seen from an obliquely upper position. FIG. 3D is a plan view illustrating the wafer illustrated in FIG. 3C. In FIG. 3D, dotted lines indicate a referential wafer grid, which is free from distortion, and solid lines indicate a wafer grid distorted by the wafer chuck. In comparison with the distortion-free grid, it is understood that the grid deforms when a distortion occurs in a contraction direction. The drawings in FIGS. 3A to 3H are exaggeratingly illustrated so that the warping state and the distortion can be understood easily. In many cases, the actual warping amount is in the order of several hundreds μm to several mm. The actual positional deviation amount is in the order of several hundreds nm to several μm. In the present exemplary embodiment, the positional deviation amount is a two-directional displacement amount of at least one point on a wafer (i.e., substrate) in the x and y directions relative to a rectangular lattice shaped wafer grid that is free from positional deviation. FIG. 3E illustrates a wafer having an upwardly protruding convex surface, which is seen from an obliquely upper position. FIG. 3F is a plan view illustrating the wafer illustrated in FIG. 3E. Further, FIG. 3G illustrates a wafer having a saddle shaped surface, which is seen from an obliquely upper position. FIG. 3H is a plan view illustrating the wafer illustrated in FIG. 3G. When the wafer is deformed into a saddle shape, the distortion has a rotationally asymmetrical shape. As mentioned above, the correlation between the warping shape and the distortion can be known beforehand as illustrated in FIGS. 3A to 3H. Therefore, it is feasible to constitute a conversion formula that is usable to convert a warping shape into a distortion with reference to the preliminarily known correlation.

First, the following formula (1) can be employed as a general formula of a first formula that represents the warping shape. The warping shape expression formula employed in the present exemplary embodiment is a high dimensional polynomial of x and y that represent coordinates of the wafer surface (i.e., substrate surface).

$$z = C00 + C10x + C01y + C20x^2 + C11xy + C02y^2 + C30x^3 + C21x^2y + C12xy^2 + C03y^3 \quad (1)$$

It is further defined that x-axis and y-axis extend from the origin positioned at the wafer center of the wafer surface and Z-axis extends in a direction perpendicular to the x and y axes. In the formula (1), "z" represents the height of the wafer at the point (x, y). More specifically, "z" represents the warping amount. The formula (1) includes a plurality of coefficients C00, C10, C01, - - - , and C03. The term C00 represents an up-and-down movement of the entire wafer. The terms of C10 and C01 are terms representing the gradient of the entire wafer. Therefore, these terms not related to the warping shape. These terms can be corrected by controlling the position and the rotation of the wafer stage 6. Accordingly, the terms expressing the warping shape are the term of C20 and subsequent terms.

Figure 4:
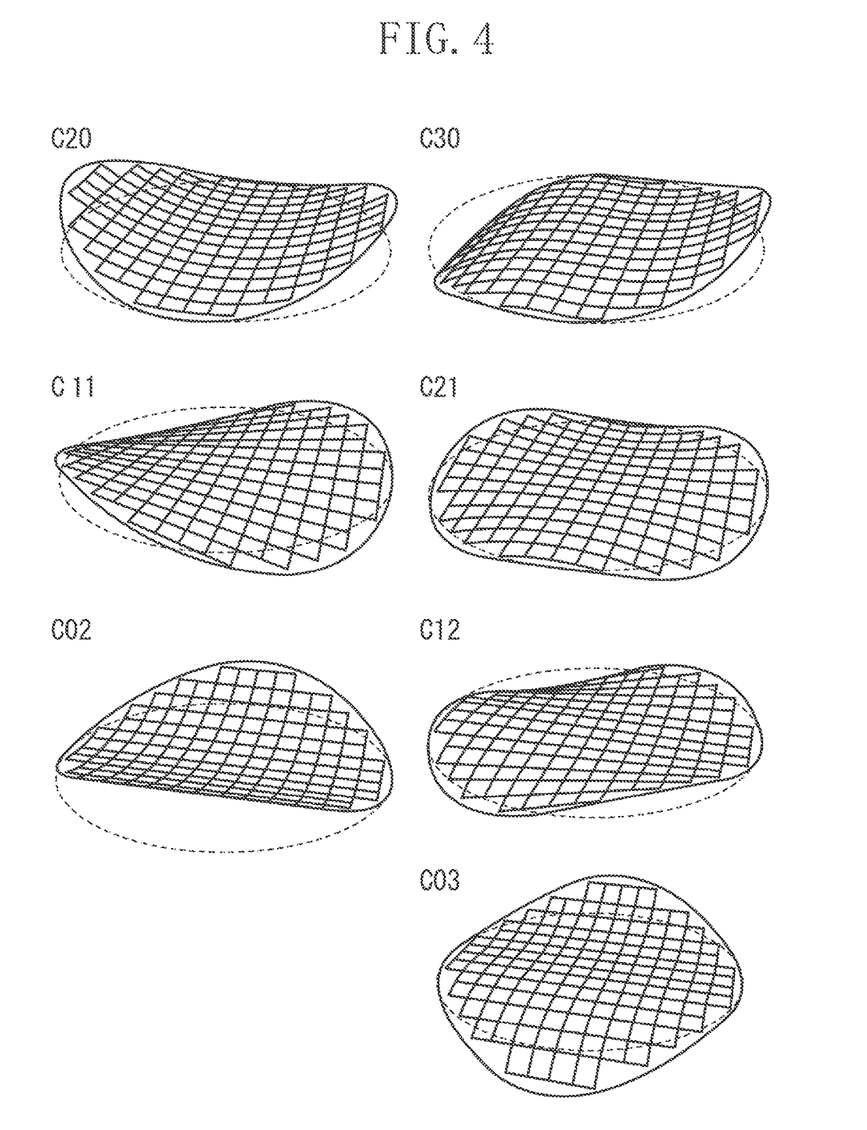
FIG. 4 illustrates a correspondence relationship between coefficients of a warping shape expression formula and corresponding warping shapes.

FIG. 4 illustrates a correspondence relationship between respective coefficients of the warping shape expression formula and corresponding warping shapes. FIG. 4 illustrates warping shapes that correspond to the coefficients of respective terms of the formula (1), more specifically, C20 to C03 (i.e., warping shape coefficient set C). Normally observed smooth warping shapes can be expressed by linearly connecting these terms. In practice, the warping shapes illustrated in FIG. 3 (i.e., the downwardly protruding convex shape, the upwardly protruding convex shape, and the saddle shaped) can be expressed by combining these terms. If a target warping shape to be expressed includes higher-order undulation components that cannot be sufficiently expressed by using the above-mentioned formula, it is desired to increase the order and/or the number of terms of the formula (1) appropriately. On the other hand, in a case where the target warping shape does not include any higher-order undulation component and reducing the calculation time is desired, it is useful to reduce the order and/or the number of terms of the formula (1). It is useful to use a high dimensional polynomial of at least 2nd order.

When the formula (1) is employed to express a warping shape, it is feasible to acquire the warping shape coefficient set C by acquiring the warping amount (z) at each of a plurality of points (x, y) on the wafer surface and fitting the acquired information to the formula (1) according to the least squares method. Then, the warping shape expression formula can be obtained by applying the acquired warping shape coefficient set C to the formula (1).

In step S03, namely after the acquisition of the warping shape information about the wafer in step S01 has been completed, the control unit 11 conveys the wafer to the wafer chuck 7 on the wafer stage 6. Then, in step S04, the control unit 11 acquires information about the positional deviation amount of the wafer.

In a state where the wafer is attached to the wafer chuck 7, an alignment scope (i.e., measurement unit) (not illustrated) measures a plurality of alignment marks on the wafer surface and the control unit 11 acquires the information about the positional deviation amount at each alignment mark. Alternatively, without measuring the alignment mark, the control unit 11 can acquire information about the positional deviation amount by performing a calculator simulation using the finite element method. Further, the exposure apparatus can acquire external positional deviation amount information. For example, an operator can input positional deviation amount information via the console of the exposure apparatus. Alternatively, in a case where the exposure apparatus is connected to a network (e.g., LAN), an external measurement device, a server, or any other apparatus connected to the network can input positional deviation amount information to the exposure apparatus via the network.

In step S05, the control unit 11 obtains a positional deviation amount expression formula beforehand based on the acquired positional deviation amount. The following formula (2) can be employed as a general formula of a second formula that represents the positional deviation amount in a state where the wafer is fixed by the wafer chuck 7. The positional deviation amount expression formula employed in the present exemplary embodiment is high dimensional polynomials of x and y that represent coordinates on the wafer surface.

$$\Delta x = A00 + A10x + A01y + A20x^2 + A11xy + A02y^2 + A30x^3 + A21x^2y + A12xy^2 + A03y^3$$

$$\Delta y = B00 + B10x + B01y + B20x^2 + B11xy + B02y^2 + B30x^3 + B21x^2y + B12xy^2 + B03y^3 \quad (2)$$

Similar to the formula (1), x and y represent the coordinates of an arbitrary point on the wafer surface. Further, $\Delta x$ represents an x-component of the positional deviation amount at the point (x, y). $\Delta y$ represents a y-component of the positional deviation amount, similarly. A00, A10, . . . A03, B00, B10, . . . , and B03 are coefficients of the formula (2).

Figure 5:
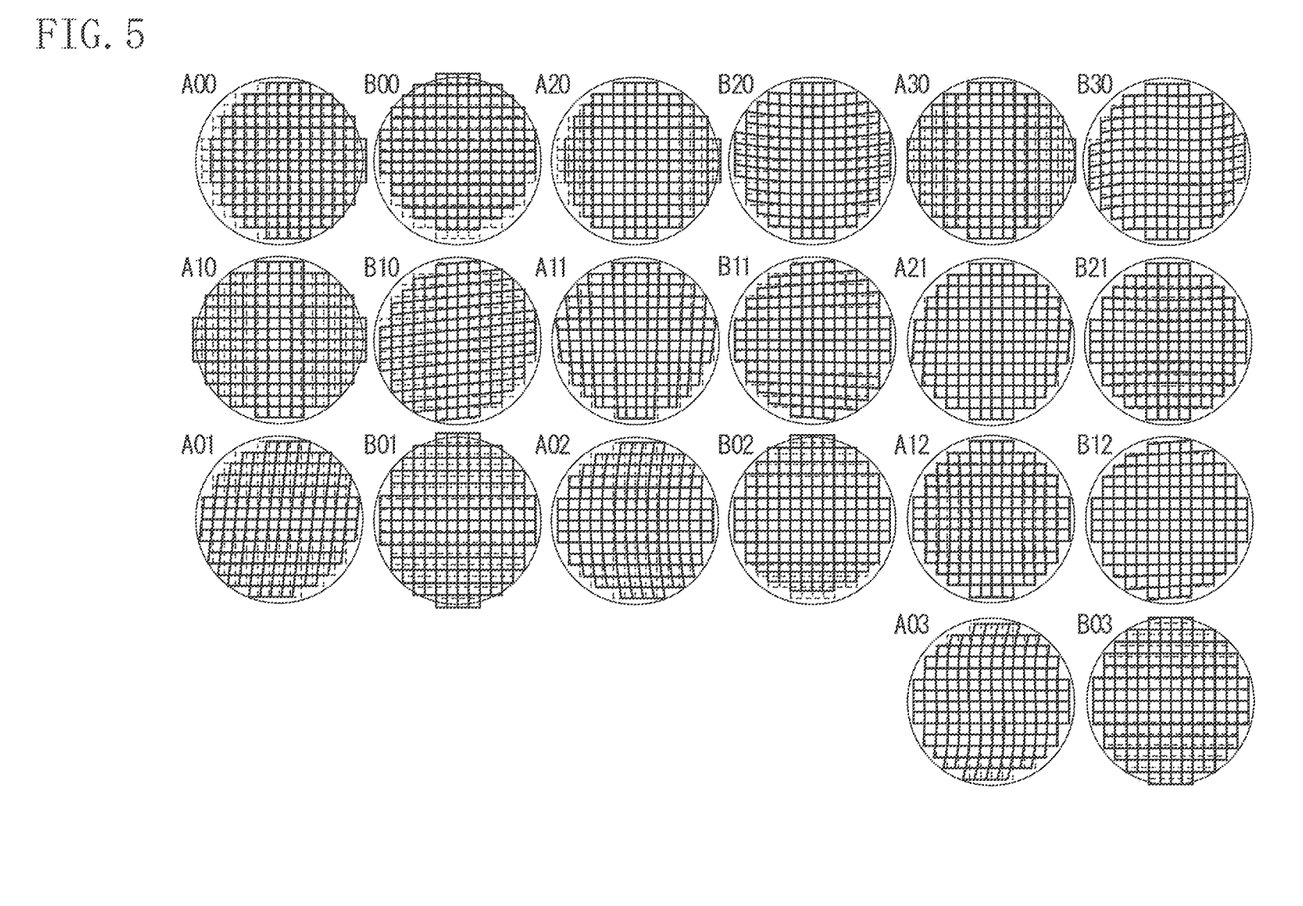
FIG. 5 illustrates a correspondence relationship between coefficients of a positional deviation amount expression formula and corresponding wafer distortion shapes.

FIG. 5 illustrates a correspondence relationship between the coefficients of the positional deviation amount expression formula and corresponding wafer distortion shapes. The wafer distortion shapes illustrated in FIG. 5 correspond to respective coefficient terms of the formula (2). General distortion shapes can be expressed by linearly connecting these terms. The distortion shapes illustrated in FIGS. 3A to 3H can be expressed by using a combination of these terms. However, the terms of A00 and B00 represent the shifting of the entire wafer and can be corrected by controlling the position of the wafer stage 6. Accordingly, the terms expressing the distortion shape are the terms of A10 and B10 and subsequent terms. Coefficients of these terms are referred to as positional deviation amount coefficient set A. If a target distortion shape to be expressed includes higher-order undulation component that cannot be sufficiently expressed by using the formula (2), it is desired to increase the order and/or the number of terms of the formula (2) appropriately. On the other hand, in a case where the target distortion shape does not include any higher-order undulation component and reducing the calculation time is desired, it is useful to reduce the order and/or the number of terms of the formula (1). It is useful to use a high dimensional polynomial of at least 1st order.

When the formula (2) is employed to express a positional deviation amount, it is feasible to acquire the positional deviation amount coefficient set A by acquiring the positional deviation amount at each of a plurality of points (x, y) on the wafer surface and fitting the acquired information to the formula (2) according to the least squares method. Then, the positional deviation amount expression formula can be obtained by applying the acquired positional deviation amount coefficient set A to the formula (2).

In step S06, the control unit 11 obtains a transformation matrix M based on the warping shape coefficient set C and the positional deviation amount coefficient set A acquired or obtained beforehand. Then, in step S07, the control unit 11 stores the obtained transformation matrix M in the storage device (not illustrated) of the control unit 11.

The following formula (3) can be employed as a third formula that is usable in conversion between the warping shape expression formula and the positional deviation amount expression formula, more specifically, as a formula capable of obtaining the transformation matrix M based on the warping shape coefficient set C and the positional deviation amount coefficient set A.

$$\begin{pmatrix} A10 \\ A01 \\ \vdots \\ B03 \end{pmatrix} = \begin{pmatrix} M11 & M12 & \ldots & M17 \\ M21 & M22 & \ldots & M27 \\ \vdots & \vdots & \ddots & \vdots \\ M181 & M182 & \ldots & M187 \end{pmatrix} \begin{pmatrix} C20 \\ C11 \\ \vdots \\ C03 \end{pmatrix} \quad (3)$$

In the formula (3), the transformation matrix M includes various elements M11, M12, . . . , and M187. In the present exemplary embodiment, the total number of warping shape coefficients is 7 and the total number of positional deviation amount coefficients is 18. Therefore, the transformation matrix M is constituted by 18 lines and 7 columns. In other words, the transformation matrix M includes 126 elements. To obtains 126 elements of the transformation matrix M, the control unit 11 acquires a plurality of pieces of data with respect to the warping shape and the positional deviation amount by measuring the warping shape and positional deviation amounts at a plurality of spots (i.e., positions) on a surface of at least one wafer in a state where the wafer is fixed by the wafer chuck. Alternatively, the control unit 11 can acquire the information about the warping shape and the positional deviation amount from a plurality of wafers having various shapes by performing a calculator simulation using the finite element method. The control unit 11 obtains the warping shape coefficient set C and the positional deviation amount coefficient set A based on the acquired warping shape and the positional deviation amount. The control unit 11 can obtain the elements of the transformation matrix M by applying and fitting the obtained information (i.e., the warping shape coefficient set C and the positional deviation amount coefficient set A) to the formula (3) according to the least squares method. In obtaining the transformation matrix M, each of the warping shape coefficient set C and the positional deviation amount coefficient set A is not limited to only one set and can be constituted by a plurality of sets. The control unit 11 stores the elements of the obtained transformation matrix M in the storage device of the control unit 11.

Figure 6:
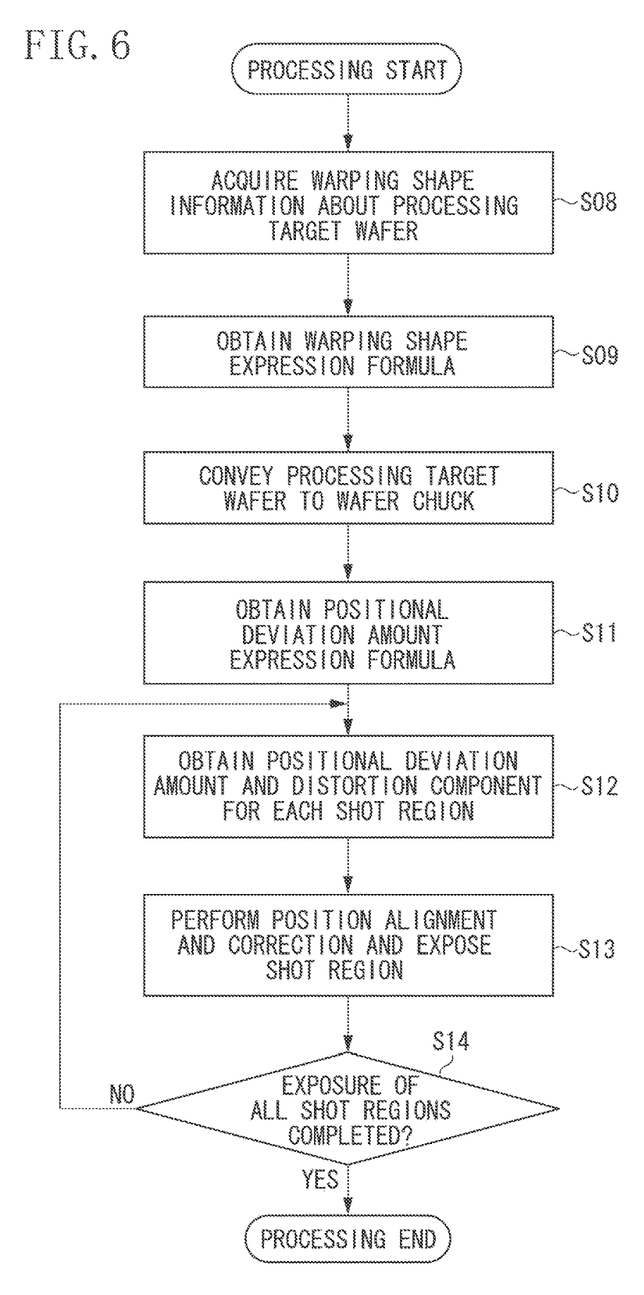
FIG. 6 is a flowchart illustrating processing for performing projection exposure position alignment and projection exposure shape correction according to a distortion derived from a warping shape of a processing target wafer and exposing shot regions.

FIG. 6 is a flowchart illustrating processing for performing the projection exposure position alignment and the projection exposure shape correction according to a distortion derived from a warping shape of a processing target wafer (i.e., processing target substrate) and exposing shot regions. In step S08, the control unit 11 acquires information about the warping shape of the processing target wafer by using a method similar to that described in step S01 of FIG. 2. In the present exemplary embodiment, the processing target wafer is a target wafer to be subjected to the exposure processing (i.e., mask pattern projection and exposure processing) of the exposure apparatus.

In step S09, the control unit 11 obtains a warping shape expression formula based on the acquired warping shape information, by using a method similar to that described in step S02 of FIG. 2.

In step S10, the control unit 11 conveys the processing target wafer to the wafer chuck 7 on the wafer stage 6.

In step S11, the control unit 11 acquires the positional deviation amount coefficient set A by calculating a product of the warping shape coefficient set C of the warping shape expression formula obtained in step S09 and the transformation matrix M stored in the storage device of the control unit 11 in step S07 of FIG. 2. Then, the control unit 11 obtains a positional deviation amount expression formula by applying the acquired coefficient set to the formula (2).

In step S12, the control unit 11 obtains a positional deviation amount and a distortion component of each shot region before exposing shot regions of the processing target wafer. The control unit 11 obtains positional deviation amounts at a plurality of positions on the processing target wafer (i.e., processing target substrate) by subtracting coordinate information about at least two points of a shot region (e.g., four corner points of the shot region) on the wafer surface into the positional deviation amount expression formula. In the present exemplary embodiment, the coordinate information is information about the coordinates in a state where no distortion is generated and can be obtained from the design values. The control unit 11 performs distortion detection by obtaining distortion components with respect to the wafer grid and the shot shape based on the obtained positional deviation amounts. In the present exemplary embodiment, the wafer grid is a lattice that defines a plurality of shot regions arranged on the wafer. The shot shape indicates the shape of each shot region on the wafer. The distortion components to be obtained in this case are a plurality of types of distortion components (e.g., positional deviation, shot rotation, shot magnification change) relating to the shot region. The distortion components can be obtained by using the least squares method.

Figure 7A:
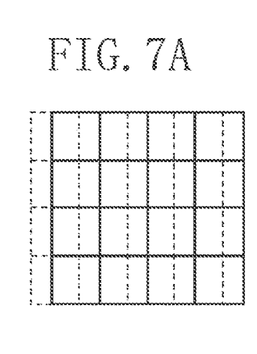
FIGS. 7A to 7H illustrate positional deviations and deformations relating to the shot regions.
Figure 7B:
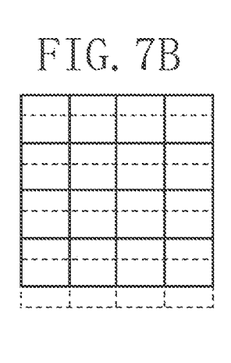
Figure 7C:
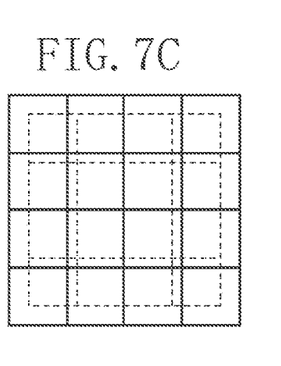
Figure 7D:
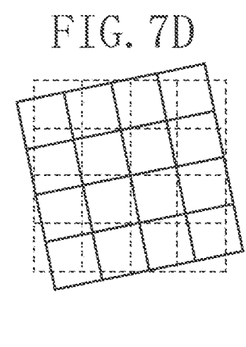

FIGS. 7A to 7H illustrate positional deviations and deformations relating to the shot region. In FIGS. 7A to 7H, dotted lines indicate a state where there is not any positional deviation and deformation, in which the external frame is the boundary of each shot region and the internal lattice is an in-shot grid. Further, solid lines indicate a state where there is a positional deviation or a deformation, in which the external frame is the boundary of each shot region and the internal lattice is an in-shot grid. FIG. 7A illustrates a positional deviation of the shot region in the x-direction. FIG. 7B illustrates a positional deviation of the shot region in the y-direction. Further, FIG. 7C illustrates a shot magnification change. FIG. 7D illustrates a shot rotation. The least squares method can be employed to obtain these distortion components based on positional deviation amounts at a plurality of positions (at least two points of the shot region). The above-mentioned distortion components include positional deviations of the shot regions (in the x-direction and the y-direction) that are components corresponding to the deformation of the wafer grid. The wafer stage 6 can be moved to perform positional alignment in such a way to change the projection exposure position. Further, regarding the shot rotation, the wafer stage 6 can be rotated to perform positional alignment. The shot magnification change corresponds to a deformation of the shot shape. A magnification adjustment mechanism 51, which is installed on the projection optical system, can be used to change a projection magnification of the projection optical system in such a way as to correct the projection exposure shape. To control the projection magnification of the projection optical system, the magnification adjustment mechanism 51 causes a part of a plurality of lenses constituting the projection optical system to move in parallel with the optical axis in such a way as to correct the projection exposure shape.

Figure 7E:
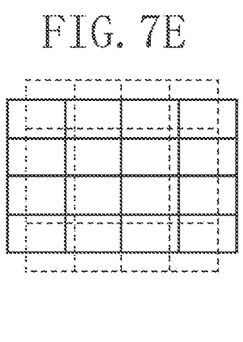
Figure 7F:
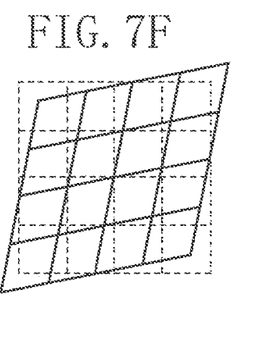
Figure 7G:
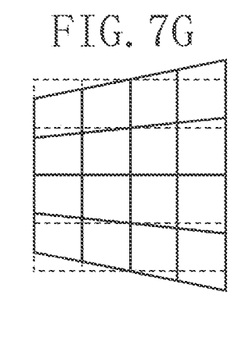
Figure 7H:
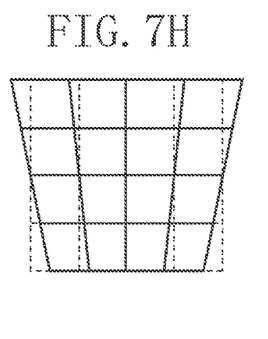

Further, the distortion component to be corrected is not limited to the above-mentioned shot magnification change and may be vertical/horizontal magnification difference component, parallelogram component (skew component), or trapezoidal component. FIG. 7E illustrates an example of the vertical/horizontal magnification difference component. FIG. 7F illustrates an example of the parallelogram component. FIGS. 7G and 7H illustrate examples of the trapezoidal component. Effectively correcting the distortion is feasible by correcting the above-mentioned examples. In this case, it is feasible to obtain the distortion component (e.g., vertical/horizontal magnification difference component, parallelogram component, or trapezoidal component) according to the least squares method with reference to positional deviation amounts acquired at a plurality of positions (at least two points) of the shot region. Hereinbelow, a method for obtaining the distortion component according to the least squares method with reference to the positional deviation amounts acquired in the shot region will be described in detail below. For example, it is assumed that $S_x$ represents the positional deviation in the x-direction and $S_y$ represents the positional deviation in the y-direction. Similarly, $R_x$ and $R_y$ represent shot rotation amounts in the x-direction and y-direction. $M_x$ and $M_y$ represent shot magnification change amounts in the x-direction and y-direction. $A_x$ and $A_y$ represent vertical/horizontal magnification difference change amounts in the x-direction and y-direction. $B_x$ and $B_y$ represent parallelogram change amounts in the x-direction and y-direction. The following formulae are xy functions that can express the positional deviation amounts $\delta_x$ and $\delta_y$ at the point (x, y) of the shot region.

$$\delta_x(x,y)=S_x-R_y+M_x+A_x+B_y$$

$$\delta_y(x,y)=S_y+R_x+M_y-A_y+B_x$$

It is assumed that $(x_1, y_1)$, $(x_2, y_2)$, ..., and $(x_n, y_n)$ represent coordinates of a plurality of points included in the shot region. $(\Delta x_1, \Delta y_1)$, $(\Delta x_2, \Delta y_2)$, ..., and $(\Delta x_n, \Delta y_n)$ represent positional deviation amounts in the x-direction and y-direction at these points. The following formula defines $\Omega$ in the present exemplary embodiment.

$$\Omega=\Sigma_{i=1\ to\ n}(\Delta x_i-\delta_x(x_i,y_i))^2+\Sigma_{i=1\ to\ n}(\Delta y_i-\delta_y(x_i,y_i))^2$$

The distortion component can be obtained from the positional deviation amounts in the shot region by obtaining $S_x$, $S_y$, M, R, A, and B that minimizes the value $\Omega$.

In step S13, the control unit 11 performs the projection exposure position alignment and the projection exposure shape correction according to the distortion component and exposes the shot region. The distortion occurring in the process of correcting a warping of the wafer induces not only a deformation of the wafer grid but also a deformation of the shot shape. Therefore, in the present exemplary embodiment, the control unit 11 performs at least one of the projection exposure position alignment and the projection exposure shape correction for each of the wafer grid and the shot shape.

In a case where the exposure apparatus is the above-mentioned step-and-repeat type, it is feasible to correct the vertical/horizontal magnification difference component and the parallelogram component by moving an optical member having a cylindrical shape (not illustrated), which is provided in the projection optical system, in parallel with the optical axis. Further, it is feasible to correct the vertical/horizontal magnification difference component, the parallelogram component, and the trapezoidal component by using a mechanism including a pair of optical elements and a driving unit (not illustrated) driving these optical elements, as discussed in Japanese Patent Application Laid-Open No. 2010-166007. Further, the trapezoidal component can be corrected by eccentrically positioning a part of the plurality of lenses constituting the projection optical system.

In a case where the exposure apparatus is the above-mentioned step-and-scan type, it is feasible to adjust only the shot magnification in a direction perpendicular to the scan direction by performing an expose operation without changing the scan speed of the wafer stage 6 while changing the projection magnification of the projection optical system. On the other hand, it is feasible to adjust only the shot magnification in a direction parallel to the scan direction by performing an expose operation without changing the projection magnification of the projection optical system while changing the scan speed of the wafer stage 6. Combining the above-mentioned expose operations in such a way as to simultaneously control the projection magnification of the projection optical system and the scan speed of the wafer stage 6 is useful to correct the vertical/horizontal magnification difference component. Further, it is feasible to correct the parallelogram component by performing a scan operation in a direction inclined relative to a scan slit. Further, it is feasible to correct the trapezoidal component by changing the projection magnification of the projection optical system during the scan operation, or by controlling the wafer stage 6 to rotate during the scan operation.

As mentioned above, it is feasible to correct a plurality of types of distortion components by controlling at least one of the projection optical system 5 and the wafer stage 6.

The distortion components of respective shot shapes are not limited to the above-mentioned examples (e.g., shot magnification change, vertical/horizontal magnification difference component, parallelogram component, and trapezoidal component). For example, increasing the positional deviation amount calculation points of the shot region is useful to calculate and correct a barrel-shaped deformation component or a bobbin-shaped deformation component. Further, if there is any correctable distortion component, it may be added to the distortion components to be corrected.

Further, the order of step S10 in FIG. 6 can be changed appropriately unless step S13 precedes step S10. Further, the processing of step S10 and the processing of another step may be performed concurrently.

Further, in step S12 of FIG. 6, the control unit obtains the distortion component of each shot region immediately before exposing each shot region. In this case, if obtaining the distortion component takes time, the throughput will decrease. Therefore, to prevent the throughput from decreasing, it is useful to obtain distortion components of all shot regions after the warping shape information has been acquired.

Further, in steps S08 to S12 of FIG. 6, the control unit 11 obtains the positional deviation amounts and the distortion components of respective shot regions without measuring any alignment mark on the processing target wafer. Further, to improve the overlay accuracy, it is useful to obtain positional deviation amounts by measuring a part of the alignment marks and combining the obtained data with positional deviation amounts obtained by using the positional deviation amount expression formula to obtain a distortion component. For example, it is useful to designate a half of the alignment marks as measuring targets beforehand and use the positional deviation amount expression formula to obtain positional deviation amounts of non-measuring alignment marks. Alternatively, in a case where the alignment marks cannot be successfully measured, it is useful to obtain positional deviation amounts by using the positional deviation amount expression formula.

In step S14, the control unit 11 determines whether the exposure of all shot regions of the processing target wafer has been completed. If the exposure of all shot regions has been completed (YES in step S14), the control unit 11 terminates the exposure processing for the processing target wafer. If the exposure of all shot regions is not yet completed (NO in step S14), the operation returns to step S12 to obtain distortion components with respect to the wafer grid and the shot shape of the next shot region.

The warping shape coefficient set C to be obtained in step S02 of FIG. 2 or in step S09 of FIG. 6 or the positional deviation amount coefficient set A to be obtained in step S05 of FIG. 2 or in step S11 of FIG. 6 may be obtained by an external device, and the control unit 11 may acquire these coefficient sets A and C from the external device beforehand. For example, an external measurement device can acquire measurement data with respect to the warping shape and the positional deviation amount. Alternatively, an external information processing apparatus may acquire comparable calculation data. The external information processing apparatus may obtain coefficient sets. An operator may input the acquired coefficient set information to the exposure apparatus via the console. Alternatively, in a case where the exposure apparatus is connected to a network (e.g., LAN), an external measurement device, a server, or any other apparatus connected to the network may input the coefficient set information to the exposure apparatus via the network.

Further, the warping shape expression formula and the positional deviation amount expression formula are not limited to the high dimensional polynomials and may be any other function formulae.

Accordingly, the exposure apparatus according to the first exemplary embodiment can perform the projection exposure position alignment and the projection exposure shape correction according to a distortion derived from a warping shape and can improve the overlay accuracy.

An exposure apparatus according to a second exemplary embodiment will be described in detail below. Features not mentioned specifically in the following description are similar to those already described in the first exemplary embodiment.

In the present exemplary embodiment, the general formula to be used in expressing the warping shape and the positional deviation amount is a Zernike polynomial having a property to be orthogonal in a unit circle.

First, the warping shape expression formula to be obtained in step S02 of FIG. 2 will be described in detail below.

The following formula (4) can be employed to express a warping shape.

$$z = C_1 Z_1(r,\theta) + C_2 Z_2(r,\theta) + \cdots + C_9 Z_9(r,\theta) \quad (4)$$

In the present exemplary embodiment, the $(r, \theta)$ coordinate plane is set on the wafer surface from the origin positioned at the wafer center and the z-axis extends in a direction perpendicular to the wafer surface. In the formula (4), "z" represents the height of the wafer at a point $(r, \theta)$. Namely, "z" represents the warping amount. It is useful to normalize the $(r, \theta)$ coordinate plane on the wafer with the wafer radius. The formula (4) includes a plurality of coefficients $C_1, C_2, \ldots,$ and $C_9$, which is the warping shape coefficient set C. Further, functions $Z_1, Z_2, \ldots,$ and $Z_9$ constitute Zernike polynomials, which can be expressed in the following manner.

$$Z_1(r,\theta) = 1$$

$$Z_2(r,\theta) = r \cos\theta$$

$$Z_3(r,\theta) = r \sin\theta$$

$$Z_4(r,\theta) = 2r^2 - 1$$

$$Z_5(r,\theta) = r^2 \cos 2\theta$$

$$Z_6(r,\theta) = r^2 \sin 2\theta$$

$$Z_7(r,\theta) = (3r^3 - 2r)\cos\theta$$

$$Z_8(r,\theta) = (3r^3 - 2r)\sin\theta$$

$$Z_9(r,\theta) = 6r^4 - 6r^2 + 1$$

If a target warping shape to be expressed includes higher-order undulation component that cannot be sufficiently expressed by using the above-mentioned formula, it is useful to increase the order and/or the number of terms of the formula (4) appropriately. For example, a Zernike polynomial composed of 36 terms is often used. On the other hand, in a case where the target warping shape does not include any higher-order undulation component and reducing the calculation time is desired, it is useful to reduce the order and/or the number of terms of the formula (4).

Further, the warping shape coefficient set C defined by the formula (4) can be obtained by using a method similar to that described in the first exemplary embodiment. The warping shape expression formula can be obtained by applying the obtained warping shape coefficient set C to the formula (4).

Next, the positional deviation amount expression formula to be obtained in step S05 of FIG. 2 will be described in detail below.

The following formulae (5) can be employed to express a positional deviation amount, similarly.

$$\Delta r = A_1 Z_1(r,\theta) + A_2 Z_2(r,\theta) + \cdots + A_9 Z_9(r,\theta)$$

$$\Delta\theta = B_1 Z_1(r,\theta) + B_2 Z_2(r,\theta) + \cdots + B_9 Z_9(r,\theta) \quad (5)$$

In the present exemplary embodiment, coordinate data $(r, \theta)$ represents an arbitrary point on the wafer surface, similar to the formula (4). Further, $\Delta r$ represents r component of the positional deviation amount at the point $(r, \theta)$. Similarly, $\Delta\theta$ represents $\theta$ component of the positional deviation amount at the point $(r, \theta)$. It is useful to normalize the $(r, \theta)$ coordinate plane on the wafer with the wafer radius. The formulae include a plurality of coefficients $A_1, A_2, \ldots, A_9$, $B_1, B_2, \ldots,$ and $B_9$, which is the positional deviation amount coefficient set A. Further, functions $Z_1, Z_2, \ldots,$ and $Z_9$ constitute Zernike polynomials, which can be expressed in the same manner as the formula (4).

If a target distortion shape to be expressed includes higher-order undulation component that cannot be sufficiently expressed by using the above-mentioned formula, it is desired to increase the order and/or the number of terms of the formula (5) appropriately. For example, using a Zernike polynomial composed of 36 terms is desired. On the other hand, in a case where the target distortion shape does not include any higher-order undulation component and reducing the calculation time is desired, it is useful to reduce the order and/or the number of terms of the formula (5).

Further, the positional deviation amount coefficient set A defined by the formula (5) can be obtained by using a method similar to that described in the first exemplary embodiment. The positional deviation amount expression formula can be obtained by applying the obtained positional deviation amount coefficient set A to the formula (5).

Next, the transformation matrix M to be obtained in step S06 of FIG. 2 will be described in detail below.

The following formula (6) is used to obtain the transformation matrix M based on the warping shape expression formula, the positional deviation amount expression formula (third formula), the warping shape coefficient set C, and the positional deviation amount coefficient set A.

$$\begin{pmatrix} A1 \\ A2 \\ \vdots \\ B9 \end{pmatrix} = \begin{pmatrix} M11 & M12 & \ldots & M19 \\ M21 & M22 & \ldots & M29 \\ \vdots & \vdots & \ddots & \vdots \\ M181 & M182 & \ldots & M189 \end{pmatrix} \begin{pmatrix} C1 \\ C2 \\ \vdots \\ C9 \end{pmatrix} \quad (6)$$

In the formula (6), the transformation matrix M includes various elements M11, M12, ..., M189. In the present exemplary embodiment, the total number of warping shape coefficients is 9 and the total number of positional deviation amount coefficients is 18. Therefore, the transformation matrix M is constituted by 18 lines and 9 columns. In other words, the transformation matrix M includes 162 elements.

Further, the elements of the transformation matrix M defined by the formula (6) can be obtained by using a method similar to that described in the first exemplary embodiment.

The warping shape expression formula and the positional deviation amount expression formula may be, for example, obtained by arbitrarily combining the high dimensional polynomials (e.g., formula (1) and formula (2)) and the Zernike polynomials (e.g., formula (4) and formula (5)) employed in the first exemplary embodiment. Further, the warping shape expression formula and the positional deviation amount expression formula are not limited to the high dimensional polynomials and the Zernike polynomials and can be any other function formulae.

Accordingly, the exposure apparatus according to the second exemplary embodiment can perform the projection exposure position alignment and the projection exposure shape correction according to a distortion derived from a warping shape and can improve the overlay accuracy.

An exposure apparatus according to a third exemplary embodiment will be described in detail below. Features not mentioned specifically in the following description are similar to those already described in the first and second exemplary embodiments.

Figure 8:
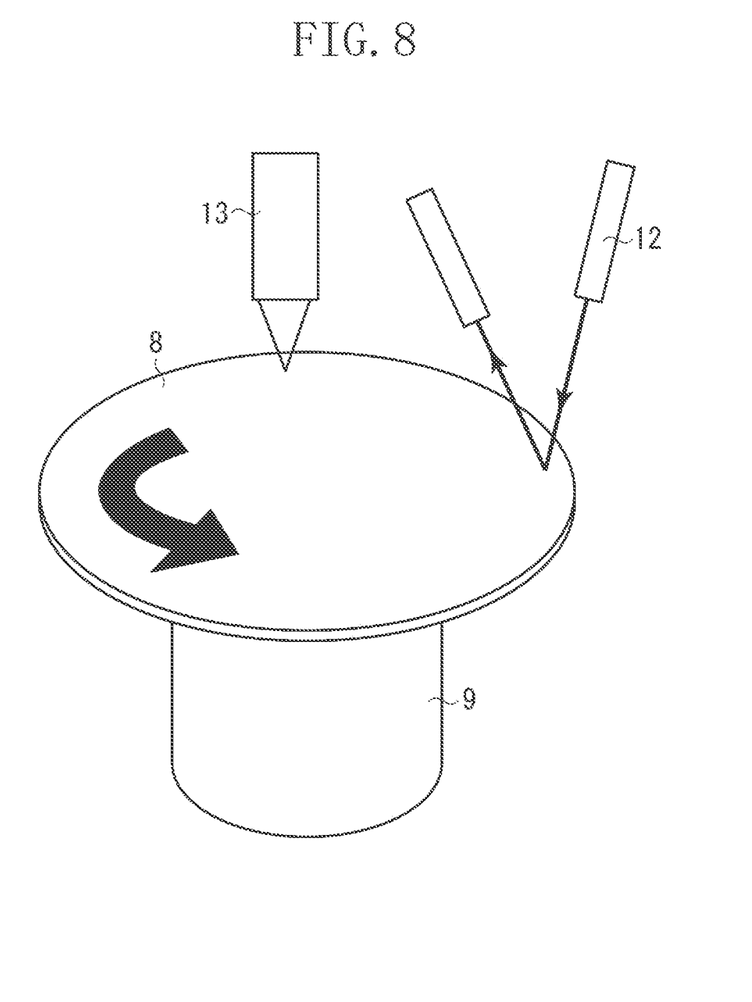
FIG. 8 illustrates a pre-alignment unit.

In the present exemplary embodiment, the pre-alignment unit 9 of the exposure apparatus measures and acquires the warping shape information to be acquired in step S01 of FIG. 2. FIG. 8 illustrates the pre-alignment unit 9. The wafer 8 is taken out of the wafer cassette 10 by a robot hand and is subsequently conveyed into the pre-alignment unit 9. The pre-alignment unit 9 is configured to be rotatable to rotate the conveyed wafer 8. An observation camera 13, which is provided above the pre-alignment unit 9, can observe a peripheral portion (e.g., edge area) of the rotating wafer 8. In this case, if the rotation center deviates from the center of the wafer 8, the edge of the wafer 8 fluctuates while the wafer 8 is rotating. Therefore, the correction of the rotation center is performed so as to match the rotation center with the center of the wafer 8. Further, an azimuth reference mark (e.g., a notch or an orientation flat) is provided on the wafer 8. The observation camera 13 can perform azimuth alignment for the wafer 8 by detecting the azimuth reference mark.

When the rotation center alignment and the azimuth alignment for the wafer 8 completes, then, a z-directional displacement measurement unit 12 provided above the pre-alignment unit 9 measures a z-directional displacement in the vicinity of the edge of the wafer 8. The z-directional displacement measurement unit 12 measures the z-directional displacement by projecting light to a measurement point and reading the position of reflection light. A laser displacement gauge or another appropriate measurement unit can be employed to measure the z-directional displacement. By performing the z-directional displacement measurement while rotating the wafer 8, z-directional displacement information about the wafer 8 can be obtained along the entire circumferential periphery thereof. The warping shape information (i.e., the z-directional displacement and the azimuth) about the wafer 8 is transmitted to the control unit 11. The control unit 11 performs processing for fitting the acquired warping shape information to the following trigonometric polynomial (7) according to the least squares method.

$$z = C0 + C1\cos\theta + S1\sin\theta + C2\cos 2\theta + S2\sin 2\theta + C3\cos 3\theta + S3\sin 3\theta \quad (7)$$

In the present exemplary embodiment, the θ-coordinate plane is set on the wafer surface from the origin positioned at the wafer center and the z-axis extends in a direction perpendicular to the wafer surface. In the formula (7), "z" represents the height of the wafer at a θ-coordinate position in the vicinity of an edge of the wafer 8. More specifically, "z" represents the warping amount. The formula (7) includes a plurality of coefficients $C_0, C_1, \ldots,$ and $S_3$, which is the warping shape coefficient set C. If a target warping shape to be expressed includes higher-order undulation component that cannot be sufficiently expressed by using the above-mentioned formula, it is desired to increase the order and/or the number of terms of the formula (7) appropriately. On the other hand, in a case where the target warping shape does not include any higher-order undulation component and reducing the calculation time is desired, it is useful to reduce the order and/or the number of terms of the formula (7).

Further, the warping shape expression formula defined by the formula (7) can be obtained by using a method similar to that described in the first exemplary embodiment. Further, the positional deviation amount expression formula can be similar to the formula (2) described in the first exemplary embodiment or the formula (5) described in the second exemplary embodiment. Therefore, the positional deviation amount expression formula can be obtained similarly.

The following formula (8) can be employed to calculate the positional deviation amount based on the warping shape expression formula by using the transformation matrix M, similarly to the first exemplary embodiment. The positional deviation amount coefficient set A is similar to that described in the first exemplary embodiment.

$$\begin{pmatrix} A10 \\ A01 \\ \vdots \\ B03 \end{pmatrix} = \begin{pmatrix} M11 & M12 & \ldots & M17 \\ M21 & M22 & \ldots & M27 \\ \vdots & \vdots & \ddots & \vdots \\ M181 & M182 & \ldots & M187 \end{pmatrix} \begin{pmatrix} C0 \\ C1 \\ \vdots \\ S3 \end{pmatrix} \quad (8)$$

Further, the elements of the transformation matrix M in the formula (8) can be obtained by using a method similar to that described in the first exemplary embodiment.

Further, the warping shape information to be acquired in step S08 of FIG. 6 can be measured and acquired by the pre-alignment unit 9 provided in the exposure apparatus.

In the present exemplary embodiment, the method to measure the z-directional displacement at the peripheral potion of each wafer is employed. However, if the z-directional displacement measurement unit is configured to move in the radius direction, it is feasible to measure the warping shape effectively because the z-directional displacement of the wafer can be measured at a plurality of points on the wafer in the radius direction. In this case, the warping shape expression formula can be obtained by using the methods described in the first and second exemplary embodiments.

Accordingly, the exposure apparatus according to the third exemplary embodiment can perform the projection exposure position alignment and the projection exposure shape correction according to a distortion derived from a warping shape, and therefore can improve the overlay accuracy. Further, the pre-alignment unit 9 can acquire information about the warping shape of the processing target wafer. Therefore, it is feasible to prevent the throughput from decreasing.

<Device Manufacturing Method>

Next, a method for manufacturing devices (e.g., semiconductor IC element, liquid crystal display element) by using the above-mentioned exposure apparatus will be described in detail below. The device manufacturing method includes a process of causing the above-mentioned exposure apparatus to expose a substrate (e.g., wafer, glass substrate, or the like) on which a photosensitive agent is coated, a process of developing the substrate (i.e., the photosensitive agent), and other conventionally known processes (e.g., etching, resist peeling, dicing, bonding, and packaging). The device manufacturing method according to the present exemplary embodiment can manufacture high-quality devices, compared to conventional methods.

The aspects of the present invention are not limited to the above-mentioned exemplary embodiments and can be modified or changed in various ways within the spirit and scope of the aspects of the invention. Further, not only the exposure apparatuses according to the first to third exemplary embodiments are implemented independently but also these exposure apparatuses can be combined appropriately.

The aspects of the present invention can provide a distortion detection method, an exposure apparatus, an exposure method, and a device manufacturing method that can improve the overlay accuracy.

While aspects of the present invention have been described with reference to exemplary embodiments, it is to be understood that the aspects of the invention are not limited to the disclosed exemplary embodiments. The scope of the following claims is to be accorded the broadest interpretation so as to encompass all such modifications and equivalent structures and functions.

This application claims the benefit of Japanese Patent Application No. 2015-173271, filed Sep. 2, 2015, which is hereby incorporated by reference herein in its entirety.

What is claimed is:

1. A method for obtaining a plurality of types of distortion components relating to a shot region of a substrate, implemented by a control unit included in an exposure apparatus configured to expose the substrate with light, the method comprising:

obtaining, by the control unit, a first formula that expresses a shape of a substrate based on information about a warping shape of the substrate in a state where the substrate is not yet held by a chuck configured to hold the substrate and included in the exposure apparatus;

converting, by the control unit, the first formula into a second formula that expresses positional deviation amounts at a plurality of positions on a surface of the substrate held by the chuck;

calculating, by the control unit, the positional deviation amounts by using the second formula; and obtaining, by the control unit, a plurality of types of distortion components relating to a shot region of the substrate, held by the chuck, based on the calculated positional deviation amounts, wherein the chuck is held by a moving unit configured to be movable and included in the exposure apparatus.

2. An exposure apparatus configured to expose a substrate with light, comprising:

a projection unit configured to project a mask pattern on the substrate;

a moving unit configured to hold and move the substrate; and a control unit, wherein the control unit obtains a first formula that expresses a shape of the substrate based on information about a warping shape of the substrate in a state where the substrate is not yet held by the moving unit, causes a conversion unit to convert the first formula into a second formula that expresses positional deviation amounts at a plurality of positions on a surface of the substrate held by the moving unit, calculates the positional deviation amounts by using the second formula, and obtains distortion components relating to a shot region of the substrate, held by the moving unit, based on the calculated positional deviation amounts, and controls at least one of the projection unit and the moving unit according to the obtained distortion components so as to overlay an image of the mask pattern on the shot region.

3. The exposure apparatus according to claim 2, wherein the second formula relates to two directions on the surface of the substrate and the positional deviation amounts at the plurality of positions relate to two directions on the surface of the substrate.

4. The exposure apparatus according to claim 2, wherein the distortion components are a plurality of types of distortion components.

5. The exposure apparatus according to claim 2, wherein the conversion unit includes a transformation matrix to obtain a plurality of coefficient values of the second formula from a plurality of coefficient values of the first formula.

6. The exposure apparatus according to claim 5, wherein the transformation matrix is obtained from a formula expressing the shape of a referential substrate, which is obtained from a general formula of the first formula and warping shape information about the referential substrate in a state where the referential substrate is not yet held by the moving unit, and a formula expressing positional deviation amounts in two directions at each position on a surface of the referential substrate, which is obtained from a general formula of the second formula and positional deviation amounts in two directions at a plurality of positions on the surface of the referential substrate in a state where the referential substrate is held by the moving unit.

7. The exposure apparatus according to claim 2, wherein the projection unit includes a projection optical system and a magnification adjustment mechanism, and wherein the control unit changes a projection magnification of the mask pattern by causing the magnification adjustment mechanism to move a lens of the projection optical system in parallel with an optical axis.

8. The exposure apparatus according to claim 2, wherein the first formula is expressed by a high dimensional polynomial of at least 2nd order.

9. The exposure apparatus according to claim 2, wherein the first formula is expressed by a Zernike polynomial or a trigonometric polynomial.

10. The exposure apparatus according to claim 2, wherein the second formula is expressed by a high dimensional polynomial of at least 2nd order.

11. The exposure apparatus according to claim 2, wherein the second formula is expressed by a Zernike polynomial.

12. The exposure apparatus according to claim 2, wherein the control unit holds information relating to the warping shape that has been input from the outside.

13. The exposure apparatus according to claim 2, further comprising a measurement unit configured to measure the warping shape, wherein the measurement unit is used to acquire information about the warping shape.

14. The exposure apparatus according to claim 2, further comprising a measurement unit configured to measure a positional deviation amount on the substrate surface, wherein the control unit obtains the second formula based on information about the measured positional deviation amount on the substrate surface.

15. An exposure method for exposing a substrate with light, comprising:
    obtaining a first formula that expresses a shape of the substrate based on information about a warping shape of the substrate in a state where the substrate is not yet held by a moving unit configured to hold and move the substrate;
    converting the first formula into a second formula that expresses positional deviation amounts at a plurality of positions on a surface of the substrate held by the moving unit;
    calculating the positional deviation amounts by using the second formula, and obtaining distortion components relating to a shot region of the substrate, held by the moving unit, based on the calculated positional deviation amounts; and
    controlling at least one of a projection unit, which is configured to project a mask pattern, and the moving unit based on the obtained distortion components so as to overlay an image of the mask pattern to be projected on the shot region of the substrate.

16. The exposure method according to claim 15, wherein the second formula relates to two directions on surface of the substrate and the positional deviation amounts at the plurality of positions relate to two directions on the surface of the substrate.

17. The exposure method according to claim 15, wherein the distortion components are a plurality of types of distortion components.

18. The exposure method according to claim 15, wherein a transformation matrix is used in the conversion for obtaining a plurality of coefficient values of the second formula from a plurality of coefficient values of the first formula.

19. The exposure method according to claim 18, wherein the transformation matrix is obtained from a formula expressing the shape of a referential substrate that is different from the substrate, which is obtained from a general formula of the first formula and warping shape information about the referential substrate in a state where the referential substrate is not yet chucked by the moving unit, and a formula expressing positional deviation amounts in two directions at each position on a surface of the referential substrate, which is obtainable from a general formula of the second formula and positional deviation amounts in two directions at a plurality of positions on the surface of the referential substrate in a state where the referential substrate is chucked by the moving unit.

20. A device manufacturing method, comprising:
    exposing a processing target substrate by using an exposure apparatus; and
    developing the exposed processing target substrate,
    wherein the exposure apparatus exposing the substrate with light includes,
        a projection unit configured to project a mask pattern on the substrate,
        a moving unit configured to hold and move the substrate, and
        a control unit,
    wherein the control unit obtains a first formula that expresses a shape of the substrate based on information about a warping shape of the substrate in a state where the substrate is not yet held by the moving unit,
    causes a conversion unit to convert the first formula into a second formula that expresses positional deviation amounts at a plurality of positions on a surface of the substrate held by the moving unit,
    calculates the positional deviation amounts by using the second formula, and obtaining distortion components relating to a shot region of the substrate, held by the moving unit, based on the calculated positional deviation amounts obtained at the plurality of positions, and
    controls at least one of the projection unit and the moving unit according to the obtained distortion components so as to overlay an image of the mask pattern on the shot region.

* * * * *